(12) United States Patent
Cahoon

(10) Patent No.: US 7,728,614 B2
(45) Date of Patent: Jun. 1, 2010

(54) OPERATING CHARACTERISTIC MEASUREMENT DEVICE AND METHODS THEREOF

(75) Inventor: B. Andrew Cahoon, Austin, TX (US)

(73) Assignee: GlobalFoundries Inc.

( * ) Notice: Subject to any disclaimer, the term of this patent is extended or adjusted under 35 U.S.C. 154(b) by 162 days.

(21) Appl. No.: 12/134,748

(22) Filed: Jun. 6, 2008

(65) Prior Publication Data
US 2009/0302860 A1     Dec. 10, 2009

(51) Int. Cl.
G01R 31/02 (2006.01)
G01R 31/28 (2006.01)

(52) U.S. Cl. .................. 324/763; 324/537; 324/765

(58) Field of Classification Search ............ 324/126, 324/127, 251–252, 117 H, 117 R, 760–765, 324/537, 771; 702/116–118
See application file for complete search history.

(56) References Cited

U.S. PATENT DOCUMENTS 7,168,853 B2 * 1/2007 Ainspan et al. ............. 374/170
7,265,531 B2 * 9/2007 Stauth et al. ............ 324/117 H

* cited by examiner

*Primary Examiner*—Minh N Tang
*Assistant Examiner*—Trung Q Nguyen

(57) ABSTRACT

A device includes an integrated circuit device having a sensor to measure an operating characteristic of the device. The sensor provides information based on the measured operating characteristic to a trigger module. In response to the information indicating the measured operating characteristic meets a threshold associated with a device failure, the trigger module provides an indication to a storage element, which stores information indicating the threshold has been met. In the event of a failure of the integrated circuit device, the storage element can be accessed by a device analyzer to retrieve the stored information to determine the cause of the device failure.

20 Claims, 2 Drawing Sheets

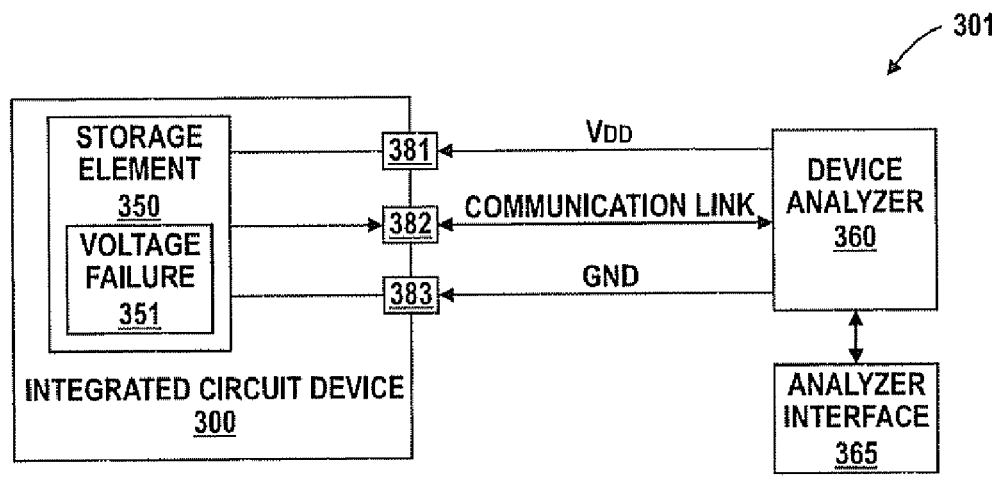
FIG. 3
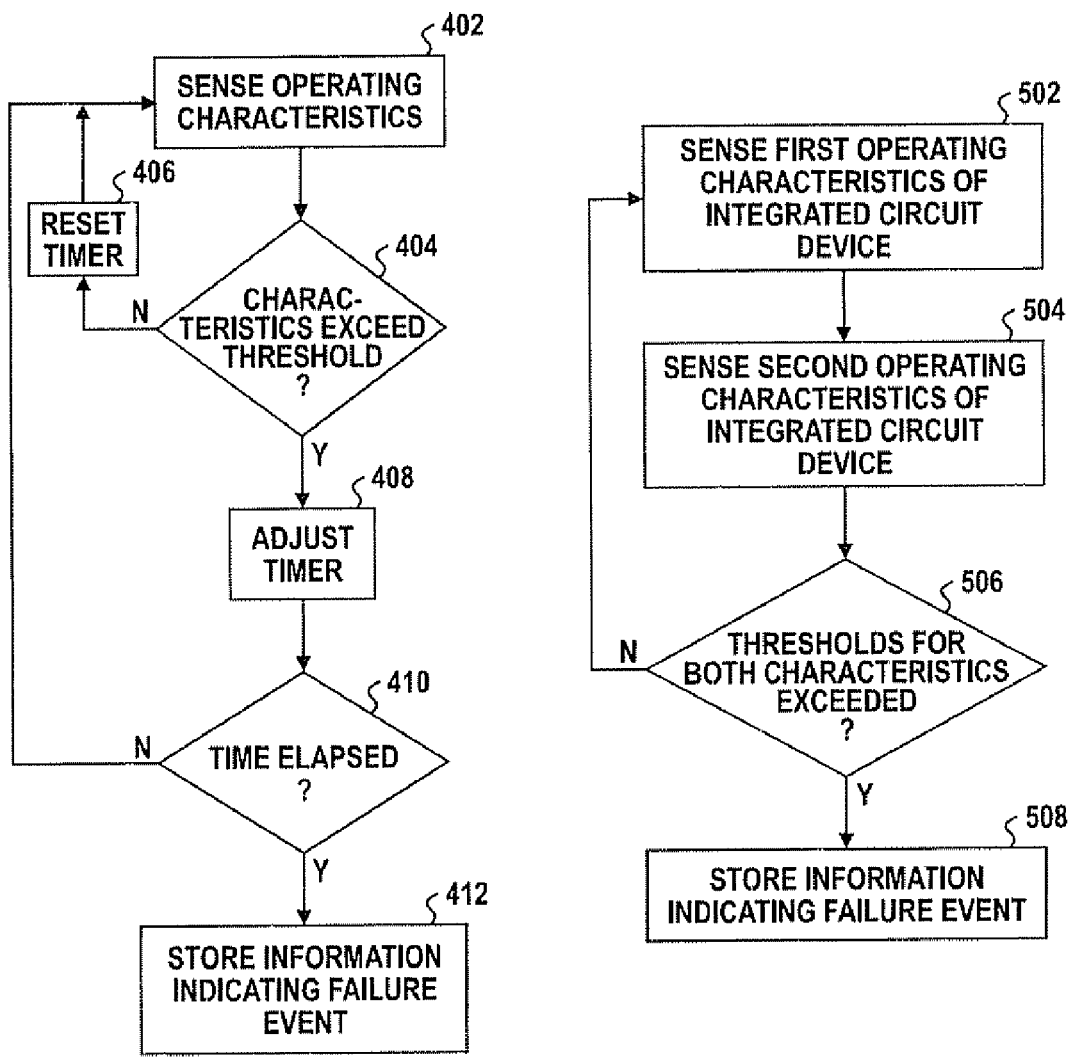
FIG. 4
FIG. 5

US 7,728,614 B2

OPERATING CHARACTERISTIC MEASUREMENT DEVICE AND METHODS THEREOF

FIELD OF THE DISCLOSURE

The present disclosure relates to devices having an integrated circuit device for measuring the operating characteristics of the integrated circuit device.

BACKGROUND

Failure of an integrated circuit device can result from exposure of the device to one of a number of operating characteristics outside a specified range. Further, combinations of operating circuit conditions can lead to device failure, even when the operating characteristics individually are within specified tolerances. Accordingly, determining the cause of integrated circuit device failure can demand a detailed analysis of the failed device, but such an analysis can be undesirably time-consuming and expensive. A device and methods for measuring the operating characteristics of an integrated circuit device would therefore be useful.

BRIEF DESCRIPTION OF THE DRAWINGS

FIG. 3 is a block diagram of an analysis system for an integrated circuit device.

FIG. 4 is a flow diagram of a method of measuring operating characteristics of an integrated circuit device according to one embodiment of the present disclosure.

FIG. 5 is a flow diagram of a method of measuring operating characteristics of an integrated circuit device according to another embodiment of the present disclosure

DETAILED DESCRIPTION

A device includes an integrated circuit device having a sensor to measure an operating characteristic of the device. The sensor provides information based on the measured operating characteristic to a trigger module. In response to the information indicating the measured operating characteristic meets a threshold associated with a device failure, the trigger module provides an indication to a storage element, which stores information indicating the threshold has been met. In the event of a failure of the integrated circuit device, the storage element can be accessed by a device analyzer to retrieve the stored information to determine the cause of the device failure.

Figure 1:
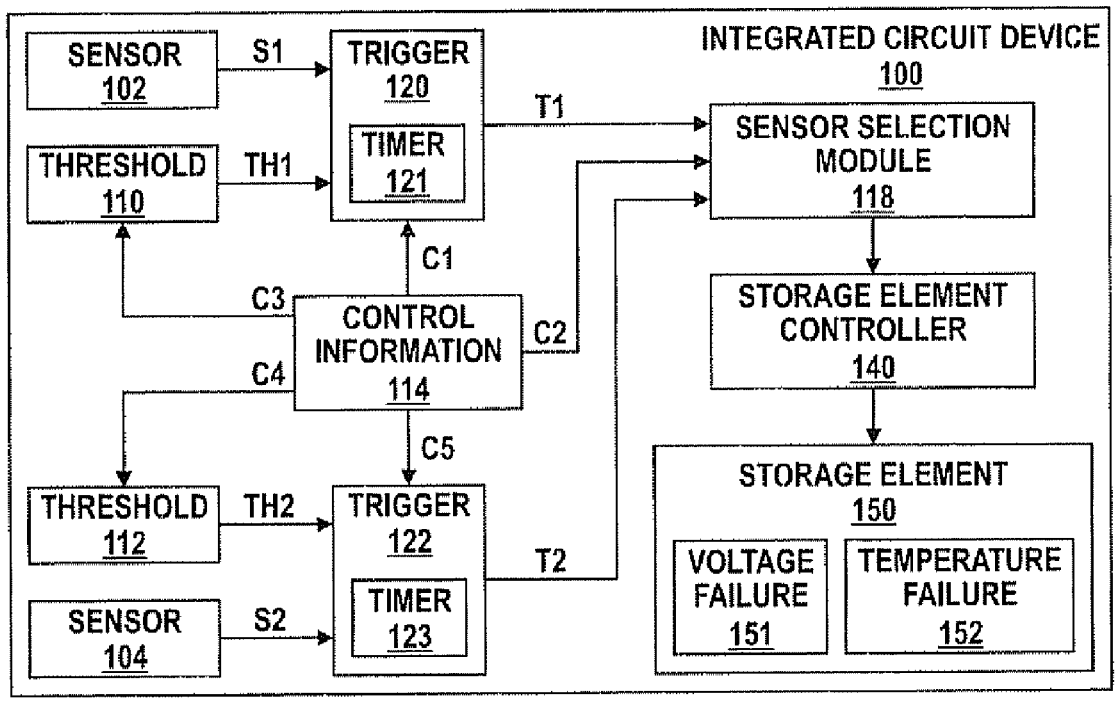
FIG. 1 is a block diagram of an integrated circuit device in accordance with one embodiment of the present disclosure.

Referring to FIG. 1, a block diagram of an integrated circuit device 100 is illustrated. The integrated circuit device includes sensors 102 and 104, threshold storage modules 110 and 112, trigger modules 120 and 122, a control information module 114, a sensor selection module 118, a storage element controller 140, and a storage element 150. The sensor 102 includes an output to provide a signal labeled "S1." The threshold storage module 110 includes an output to provide a signal labeled "TH1" and an input to receive a control signal labeled "C3." The trigger module 120 includes an input to receive the signal S1, an input to receive the signal TH1, an input to receive a signal labeled "C1.", and an output to provide a signal labeled "T1." In addition, the trigger module 120 includes a timer 121.

The sensor 104 includes an output to provide a signal labeled "S2." The threshold storage module 112 includes an output to provide a signal labeled "TH2" and an input to receive a control signal labeled "C4." The trigger module 122 includes an input to receive the signal S2, an input to receive the signal TH2, an input to receive a signal labeled "C5", and an output to provide a signal labeled "T2." In addition, the trigger module 122 includes a timer 123.

The sensor selection module 118 includes an input to receive the signal T1, an input to receive the signal T2, an input to receive a signal labeled "C2", and an output. The storage element controller 140 includes an input connected to the output of the sensor selection module 118 and an output. The storage element 150 includes an input connected to the output of the sensor selection module 118.

The sensors 102 and 104 are each configured to sense an operating characteristic of the integrated circuit device 100. As used herein, an operating characteristic refers to a device parameter that affects operation of the integrated circuit device 100 and can lead to device failure. Examples of types of operating characteristics include environmental characteristics, such as device temperature, pressure, humidity, and the like, electrical characteristics such as voltage levels, current levels, clock frequency, and the like, and operating characteristics controlled external to the integrated circuit device 100, such as a power supply voltage or frequency of an external clock signal applied to an external pin or other external input of the integrated circuit device 100. In the illustrated embodiment of FIG. 1, the sensors 102 and 104 are each associated with a different operating characteristic type. For example, the sensor 102 can sense a voltage of the integrated circuit device 100, and the sensor 104 can sense a temperature of the device. Each of the sensors 102 and 104 is configured to provide information indicating the sensed operating characteristic via an associated output signal. Thus, in the illustrated embodiment, the sensor 102 is configured to indicate the sensed operating characteristic by providing information via the signal S1, and the sensor 104 is configured to indicate the sensed operating characteristic by providing information via the signal S2. In an embodiment, the signals S1 and S2 are voltage signals, whereby a voltage of each signal is indicative of the sensed operating characteristic. Thus, if the sensor 104 is a temperature sensor, a voltage of the signal S2 can be based on the sensed temperature. In other embodiments, the signals S1 and S2 can be one or more digital signals indicative of the sensed operating characteristic. In still another embodiment, the signals S1 and S2 can be current signals, whereby a current of each signal is indicative of the sensed operating characteristic.

The threshold storage modules 110 and 112 are each configured to store information indicative of an operating characteristic threshold, whereby the operating characteristic thresholds are based on control information provided via the signals C3 and C4, respectively. In the illustrated embodiment, the threshold storage modules 110 and 112 are each associated with a different operating characteristic type. Thus, for example, the threshold information stored at the threshold storage module 110 can be indicative of a voltage threshold, while the threshold storage information stored at the threshold storage module 112 is indicative of a temperature threshold. In an embodiment, the threshold information stored at the modules 110 and 112 can each be indicative of a threshold level associated with a failure of the integrated circuit device 100. As used herein, failure of an integrated circuit device refers to a portion of the device being rendered inoperable due to physical damage of the device, such that the integrated circuit device cannot be restored to operability via a device reset or restart. It will be appreciated that, in the illustrated embodiment of FIG. 1, the threshold storage modules 110 and 112 are programmable in that the information stored at each module can be set based on the associated control signal. In other embodiments, the information stored at one or both of the threshold storage modules 110 and 112 can be based on the design of the module, such that the information is fixed or hard-wired in the design.

Failure of the integrated circuit device 100 can result if an operating characteristic meets its associated operating characteristic threshold, either instantaneously or for a particular amount of time. For purposes of discussion, an occurrence of one or more operating characteristics exceeding a threshold that can lead to failure of the integrated circuit device 100 is referred to herein as a failure event. Thus, if the operating temperature of the integrated circuit device 100 meets a temperature threshold for the device for a designated amount of time, the integrated circuit device is likely to experience a failure event associated with temperature.

The trigger module 120 is configured to receive operating characteristic information via the signal SI and operating characteristic threshold information via the signal TH1. The trigger module 120 is configured to compare the received information and, in response to determining an operating characteristic of the integrated circuit device 100 has met or exceeded an associated threshold, provide information via the signal T1 indicating the threshold has been met. For purposes of discussion, the information provided by a trigger in response to an operating characteristic meeting a threshold is referred to herein as trigger information. Thus, the provision of trigger information by the trigger module 120 indicates that the operating characteristic associated with the signal S1 has met the operating characteristic threshold associated with the signal TH1, and therefore indicates that a failure event has occurred.

The trigger module 120 can be configured to provide trigger information in response to an operating characteristic threshold being met for a specified period of time. In particular, the timer 121 can be configured to indicate when a designated period of time has elapsed. In response to the S1 signal indicating the operating characteristic has met the threshold indicated by the TH1 signal, the trigger module 120 can initiate the timer 121. In response to determining the operating characteristic meets the operating characteristic threshold for the designated period of time, as indicated by the timer 121, the trigger module 120 can provide the trigger information.

In one embodiment, the trigger module 120 can reset the timer 121 each time the operating characteristic does not meet the operating characteristic threshold. Accordingly, in this embodiment trigger information will only be provided by the trigger module 120 in response to the operating characteristic meeting the operating characteristic threshold continuously for the period of time indicated by the timer 121. In another embodiment, the trigger module 120 can suspend adjustment of the value stored at the timer 121, without resetting the stored value, each time the operating characteristic does not meet the operating characteristic threshold. In this embodiment, trigger information is provided by the trigger module 120 in response to the operating characteristic meeting the operating characteristic threshold for the designated period of time in the aggregate. In the illustrated embodiment, the designated period of time indicated by the timer 121 is programmable based on control information provided by the signal C1.

The trigger module 122 is configured similarly to the trigger module 120, and is configured to provide trigger information via the signal T2 based on a comparison of operating characteristic information received via the signal S2 and operating characteristic threshold information received via the signal TH2. In addition, the trigger module 122 can be configured to employ timer 123 in order to provide trigger information based on the operating characteristic associated with the signal S2 meeting the operating characteristic threshold associated with the signal TH2 for a designated period of time, in similar fashion to that described above with respect to trigger module 120.

The sensor selection module 118 is configured to receive trigger information via the signals T1 and T2. Based on the received trigger information, and control information received via the signal C2, the sensor module 118 provides storage information at its output to indicate one or more operating characteristics of the integrated circuit device 100 has been met. The storage information can be provided based on individual operating characteristic thresholds being met, or based on a combination of operating characteristic thresholds being met. For example, the sensor selection module 118 can provide the storage information in response to a voltage threshold being met, in response to a temperature threshold being met, or in response to a combination of both the voltage and temperature thresholds being met at the same time, over the same period of time, or at disparate points in time. The sensor selection module 118 determines which operating characteristics can result in provision of storage information based on control information received via the signal C2. In addition, the sensor selection module 118 can determine other information, such as a date or time that a particular failure event or combination of failure events occurred.

The storage element controller 140 is configured to receive storage information and store it at the storage element 150. In an embodiment, the storage element 150 is configured to maintain stored information in the absence of power being provided to the integrated circuit device 100. Thus, the storage element 150 can be non-volatile memory, such as flash memory or a hard disk, a set of programmable fuses, and the like. The storage element 150 includes a number of storage locations, such as storage locations 150 and 151, whereby each storage location is associated with an operating characteristic of the integrated circuit device 100. In response to receiving storage information indicating a failure event associated with an operating characteristic has occurred, the storage element controller 140 stores the information at the storage location associated with the operating characteristic. For example, in the illustrated embodiment of FIG. 1, the storage location 151 is associated with a voltage of the integrated circuit device 100. Accordingly, in response to receiving storage information indicating the voltage threshold for the integrated circuit device has been met, the storage element controller 140 stores the information at the storage location 151. The storage element controller 140 can also store other information at the storage element 150, such as information indicating when (e.g. a date, time, or combination thereof) that a particular failure event or combination of failure events occurred.

In an embodiment, each of the storage locations of the storage element 150 represents a single bit of information. Accordingly, by setting a storage location to a specified state, the memory controller 140 indicates the operating characteristic associated with the storage location has resulted in a failure event for the integrated circuit device 100.

The control information storage module 114 is configured to store control information for the integrated circuit device 100. In the illustrated embodiment of FIG. 1, the control information storage module 114 can store control information designating which operating characteristics of the device are to be measured, the associated operating characteristic thresholds, specified timing periods for the timers 121 and 123, and the like. In an embodiment, the control information is programmable. In another embodiment, the control information is established by the design of the integrated circuit device 100. For example, the control information can be fixed or hard-wired by design.

The operation of the integrated circuit device 100 can be better understood with reference to an example. In this example, the sensor 102 is configured to sense a temperature of the integrated circuit device 100, and the threshold storage module 110 stores information indicative of a temperature threshold. The trigger module 120 compares the sensed temperature, as indicated by the signal S1, to the temperature threshold, as indicated by the signal TH1. In response to the sensed temperature meeting the temperature threshold for a designated period of time (as indicated by the timer 121), the trigger module 120 provides trigger information via the signal T1. In response to the trigger information, the sensor selection module 118 determines, based on the control information provided via the signal C2, whether a failure event associated with temperature is designated to be recorded at the storage element 150. If so, the sensor selection module 118 provides storage information to the storage element controller 150. In response, the storage element controller 150 stores an indication of the failure event at the storage location 152.

Accordingly, in the illustrated embodiment of FIG. 1, the occurrence of designated types of failure events are recorded at the storage element 150. In the event of failure of the integrated circuit device 100, the storage element 150 can be accessed and the recorded failure events analyzed to determine a likely cause of failure of the device. Thus, the need for expensive and time-consuming analyses to determine a cause of failure for the integrated circuit device 100 is reduced.

Figure 2:
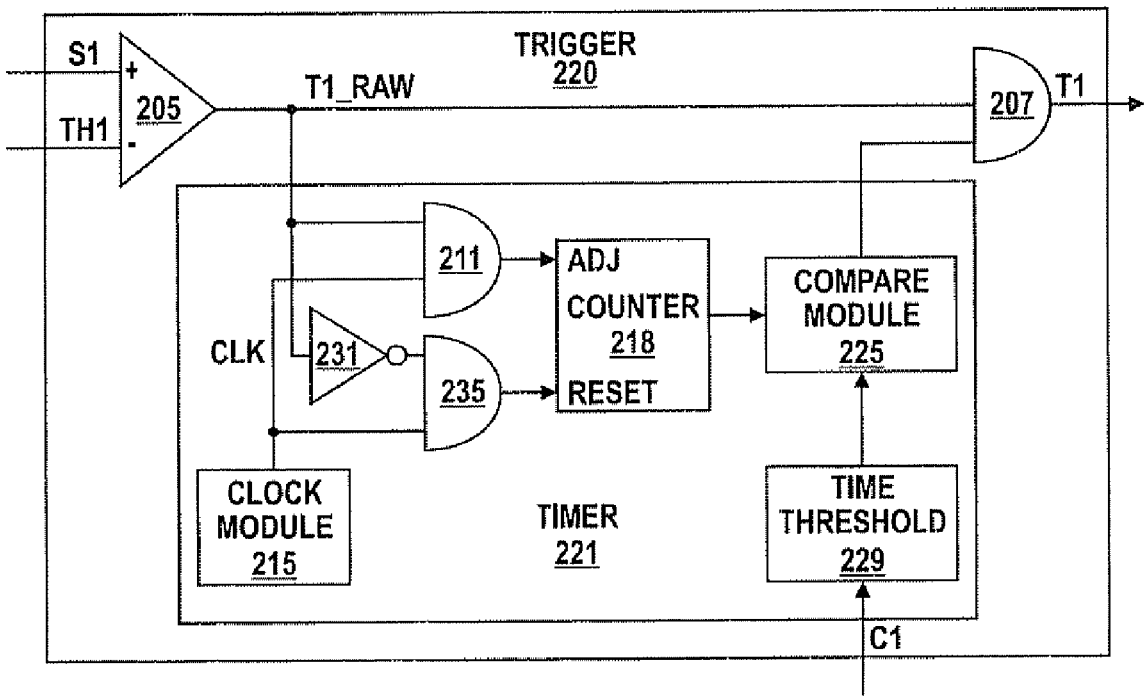
FIG. 2 is a combined block and circuit diagram of a particular embodiment of a trigger module of the integrated circuit device of claim 1.

Referring to FIG. 2, a combined block and circuit diagram of a particular embodiment of a trigger module 220, corresponding to the trigger module 120 of FIG. 1, is illustrated. The trigger module 220 includes a timer 221, a comparator 205, and an AND gate 207. The timer 221 includes a time threshold module 229, a compare module 225, a counter 218, AND gates 211 and 235, inverter 231, and clock module 215. The comparator 205 includes an input to receive the signal S1, an input to receive the signal TH1, and an output to provide a signal labeled "T1_RAW." The clock module 215 includes an output to provide a signal labeled "CLK." The AND gate 211 includes an input to receive the signal T1_RAW, an input to receive the clock signal CLK, and an output. The inverter 231 includes an input to receive the signal T1_RAW and an output. The AND gate 235 includes an input to receive the signal CLK, and an output.

The counter 218 includes an input labeled "ADJ" connected to the output of the AND gate 211, an input labeled "RESET" connected to the output of the AND gate 235, and an output. The time threshold module 229 includes an input to receive the signal C1 and an output. The compare module 225 includes an input connected to the output of the time threshold module 229, an input connected to the output of the counter, and an output. The AND gate 207 includes an input to receive the signal T1_RAW, an input connected to the output of the compare module 225, and an output to provide the signal T1.

The clock module 215 is configured to provide a periodic clock signal via CLK. It will be appreciated that although for purposes of illustration the clock module is illustrated as internal to the trigger module 220, in other embodiments the clock signal CLK can be generated external to the trigger module 220, and can be based on a common system clock of the integrated circuit device 100.

The time threshold module 229 is configured to indicate a value representative of a specified amount of time. In one embodiment, the time threshold module 229 is configured to store the representative value in a register or other storage location. In the illustrated embodiment, the specified amount of time can be indicated by control information provided via the control signal C1. The compare module 225 is configured to compare time information provided at each of its inputs and provide information at the output indicating whether the specified amount of time has been met.

The counter 218 is configured to set a value stored at the counter to a specified initial value in response to assertion of a signal at the RESET input. The counter 218 is further configured to adjust its stored value in response to assertion of a signal at the ADJ input. In one embodiment, assertion of the signal causes the stored value to be incremented, while in another embodiment assertion of the signal at the ADJ input causes a reduction in the stored value. In a particular embodiment, the value stored at the counter 218 is a Gray code value, such that each adjustment of the counter causes a change in a single bit of the stored value.

In operation, the comparator 205 compares the voltage levels of the signals S1 and TH1, representing a measured operating characteristic and operating characteristic threshold, respectively. In response to determining the voltage level of S1 does not meet the voltage level of TH1 (indicating the measured operating characteristic does not meet the operating characteristic threshold), the comparator 205 negates the signal T1_RAW. This causes a reset of the value stored at the counter 218 at the next rising edge of the clock signal CLK. In response to determining the voltage level of SI does meet the voltage level of TH1 (indicating a potential failure event at the integrated circuit device 100), the comparator 205 asserts the signal T1_RAW. This causes the value stored at counter 218 to be adjusted at each rising edge of the clock signal CLK.

The compare module 225 compares the value stored at the counter 218 to information provided by the time threshold module 229. The comparison indicates whether the measured operating characteristic has met the operating characteristic threshold for a specified amount of time, thereby indicating whether a failure event has occurred. In response to the comparison indicating a failure event, the compare module 225 asserts a signal at the output. The AND gate 207 performs a logical AND operation on the asserted signal and the signal T1_RAW, resulting in assertion of the signal T1. Thus, in response to a failure event, the trigger module 220 indicates the event by asserting signal T1.

Referring to FIG. 3, a block diagram of a particular embodiment of an analysis system 301 is illustrated. The system 301 includes an integrated circuit device 300, corresponding to the integrated circuit device 100 of FIG. 1. The system 301 further includes a device analyzer 360 and an analyzer interface 365. The integrated circuit device 300 includes pins 381, 382, and 383, and storage element 350. The device analyzer includes an output connected to pin 381, an output connected to pin 382, and a bi-directional connection to pin 382. The device analyzer 360 further includes a bi-directional connection to the analyzer interface 365.

The storage element 350 is includes storage locations, such as storage location 351, that indicate the occurrence of failure events at the integrated circuit device 300 in similar fashion to that described above with respect to FIG. 1. In response to application of supply voltages at the pins 381 and 383, the storage element 350 is configured to be placed in an accessible state. In an embodiment, the pins 381 and 383 are independent of other supply voltage pins of the integrated circuit device 300, permitting the storage element 350 to be placed in the accessible state without placing other portions of the integrated circuit device 300 in an operational mode. This allows the storage element 350 to be accessible even in the event of a failure of the integrated circuit device 300.

In the accessible state, the storage element 350 is configured to indicate, in response to requests received via pin 182, the information stored at one or more storage locations. The stored information is indicated via signals provided to pin 382.

The device analyzer 360 is configured to provide supply voltages to pins 381 and 383 of the integrated circuit device 300. Further, in response to requests from the analyzer interface 365, the device analyzer is configured to request the status of storage locations at the storage element 350 via pin 382, to receive status information in response to the request, and indicate the status information to the analyzer interface 365. The analyzer interface 365 is a user interface, such as a graphical user interface (GUI), that is configured to request status information for the integrated circuit device 300 in response to user interactions with the interface, and to display information indicative of responses to the request.

The operation of the analysis system 301 can be better understood with reference to an example. In the example, it is assumed that the integrated circuit device 300 has failed due to a supply voltage meeting a specified level. The failure event causing failure of the integrated circuit device 300 has been detected and recorded, as described above with respect to FIG. 1. In particular, the voltage failure of the integrated circuit device 300 has been recorded at storage location 351 of the storage element 350.

A user has connected the integrated circuit device 300 to the device analyzer 360 for analysis. The device analyzer 360 provides supply voltages to the integrated circuit device 300 via pins 381 and 383, thereby placing the storage element 350 in an accessible state. At the analyzer interface 350, the user requests failure information for the integrated circuit device 300. In response, the device analyzer 360 requests status information for the storage locations of the storage element 350 via pin 382. The storage element 350 provides the requested information, including the status of storage element 351, via pin 382 in response to the request. The device analyzer 360 analyzes the provided status information, and determines that the status of storage location 351 indicates a supply voltage failure. Accordingly, the device analyzer displays information via the analyzer interface 365 indicating the integrated circuit device 300 failed due to the supply voltage being met. Thus, in the illustrated embodiment of FIG. 3, a user can access failure information stored at an integrated circuit device, allowing the user to identify potential causes of device failure without an expensive and time-consuming analysis of the device.

Referring to FIG. 4, a flow diagram of a particular embodiment of a method of measuring an operating characteristic of an integrated circuit device is illustrated. At block 402, an operating characteristic of the integrated circuit device is sensed. At block 404, it is determines whether the sensed operating characteristic meets an associated operating characteristic threshold. If not, the method flow moves to block 406 and a value stored at a timer associated with the sensed operating characteristic is reset. The method flow returns to block 402 to again sense the operating characteristic.

If, at block 404, it is determined that the sensed operating characteristic threshold does meet the operating characteristic threshold, the method flow proceeds to block 408 and the value stored at the timer is adjusted. At block 410, it is determined whether the value stored at the timer indicates that a specified amount of time has expired. If not, the method flow returns to block 402. If the specified amount of time has expired, the method flow moves to block 412 and information is stored indicating that a failure event associated with the sensed operating characteristic is stored at a storage element of the integrated circuit device.

Referring to FIG. 5, a flow diagram of an alternative embodiment of a method of measuring an operating characteristic of an integrated circuit device is illustrated. At block 502, a first operating characteristic of an integrated circuit device is sensed at the device. At block 504, a second operating characteristic of the integrated circuit device is sensed. In an embodiment, the first and second operating characteristics are of different operating characteristic types.

At block 506, it is determines whether the sensed first and second operating characteristics each meet an operating characteristic threshold associated with the sensed characteristic. For example, if the first operating characteristic is a supply voltage, it is determined whether the sensed characteristic meets a specified supply voltage threshold. If one of the sensed first and second operating characteristics does not meet the associated threshold, the method flow returns to block 502. If both sensed operating characteristics meet their associated thresholds, the method flow proceeds to block 508 and information is stored indicating a failure event associated with the first and second operating characteristics is stored at a storage element of the integrated circuit device. Accordingly, the method illustrated at FIG. 5 allows failure events resulting from more than one operating characteristic to be stored. For example, the first operating characteristic can be a supply voltage and the second operating characteristic can be a temperature of the integrated circuit device. The illustrated embodiment of FIG. 5 provides for recording of a failure event resulting from a combination of supply voltage and temperature conditions.

Other embodiments, uses, and advantages of the disclosure will be apparent to those skilled in the art from consideration of the specification and practice of the disclosure disclosed herein. It will be appreciated that, as used herein, an operating characteristic threshold has been meeted when the operating characteristic falls outside of an operating range indicated by the threshold. For example, an operating characteristic threshold associated with a lower boundary of an operating temperature range will be met if the operating characteristic falls below the threshold. In contrast, an operating characteristic threshold associated with the upper boundary of the operating temperature range will be met if the operating characteristic falls above the threshold. It will further be appreciated that, although some circuit elements and modules are depicted and described as connected to other circuit elements, the illustrated elements may also be coupled via additional circuit elements, such as resistors, capacitors, transistors, and the like. The specification and drawings should be considered exemplary only, and the scope of the disclosure is accordingly intended to be limited only by the following claims and equivalents thereof.

What is claimed is:

1. A device comprising:
a first sensor comprising an output configured to provide first information indicative of a first operating characteristic of an integrated circuit device;
a first trigger module comprising a first input coupled to the output of the first sensor, a second input configured to receive second information indicative of a first operating characteristic threshold, and an output configured to provide third information in response to the first operating condition meeting the first operating characteristic threshold; and
a storage element coupled to the output of the first trigger module, the storage element configured to store information indicative of a failure of the integrated circuit device in response to the third information.

2. The device of claim 1, wherein the first operating characteristic threshold is indicative of a specified operating characteristic associated with a failure of the integrated circuit device.

3. The device of claim 1, wherein the first operating characteristic is an environmental operating characteristic.

4. The device of claim 3, wherein the first operating characteristic is a temperature.

5. The device of claim 1, wherein the first operating characteristic is an electrical characteristic.

6. The device of claim 5, wherein the first operating characteristic is an operating characteristic controlled external to the integrated circuit device.

7. The device of claim 1, wherein the first trigger module comprises a timer configured to initiate periodic adjustment of a value stored at a counter in response to the first operating characteristic meeting the first operating characteristic threshold at a first time, the output of the first trigger module configured to provide the third information in response to the value stored at the counter meeting a specified time threshold.

8. The device of claim 7, wherein the timer is configured to suspend periodic adjustment of the value stored at the counter in response to the first operating characteristic not meeting the first operating characteristic threshold at a second time, the second time after the first time.

9. The device of claim 8, wherein the timer is configured to resume periodic adjustment of the value stored at the counter in response to the first operating characteristic meeting the first operating characteristic threshold at a third time, the third time after the second.

10. The device of claim 7, wherein the timer is configured to reset the value stored at the counter to a specified initial value in response to the first operating characteristic not meeting the first operating characteristic threshold at a second time, the second time after the first time.

11. The device of claim 1, further comprising:
a second sensor comprising an output configured to provide fourth information indicative of a second operating characteristic of an integrated circuit device; and
a second trigger module comprising a first input coupled to the output of the second sensor, a second input configured to receive fifth information indicative of a second operating characteristic threshold, and an output coupled to the storage element, the output configured to provide sixth information in response to the second operating condition meeting the second operating characteristic threshold.

12. The device of claim 11, wherein the first operating characteristic is of a first operating characteristic type and the second operating characteristic is of a second operating characteristic type.

13. The device of claim 11, further comprising:
a selection module coupled between the output of the first trigger module and the storage element, the selection module comprising a first input coupled to the output of the first trigger module, a second input coupled to the output of the second trigger module, and an output configured to provide seventh information in response to the third information and the sixth information; and
wherein the storage element is configured to store information indicative of the failure of the integrated circuit device in response to the seventh information.

14. The device of claim 13, wherein the first operating characteristic is of a first operating characteristic type and the second operating characteristic is of a second operating characteristic type.

15. The device of claim 13, wherein the selection module is configured to provide the seventh information in response to the third information and the sixth information indicating that the first operating characteristic has met the first operating characteristic threshold and that the second operating characteristic has met the second operating characteristic threshold.

16. The device of claim 11, wherein the first operating characteristic is an environmental operating characteristic and the second operating characteristic is an electrical operating characteristic.

17. The device of claim 16, wherein the first operating characteristic is a temperature.

18. The device of claim 11, wherein the first operating characteristic is an operating characteristic controlled external to the integrated circuit device.

19. The device of claim 1, wherein the storage element comprises flash memory.

20. The device of claim 1, wherein the storage element comprises a programmable fuse.

* * * * *